(12) United States Patent
Ando et al.

(10) Patent No.: US 11,750,174 B2
(45) Date of Patent: Sep. 5, 2023

(54) FILTER ASSEMBLY WITH TWO TYPES OF ACOUSTIC WAVE RESONATORS

(71) Applicant: Skyworks Solutions, Inc., Irvine, CA (US)

(72) Inventors: Yoshiaki Ando, Yokosuka (JP); Yasuyuki Saito, Kadoma (JP); Hiroyuki Nakamura, Osaka-Fu (JP)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 17/364,314

(22) Filed: Jun. 30, 2021

(65) Prior Publication Data

US 2022/0006444 A1 Jan. 6, 2022

Related U.S. Application Data

(63) Continuation of application No. 16/373,394, filed on Apr. 2, 2019, now Pat. No. 11,101,787.

(Continued)

(51) Int. Cl.
*H03H 9/70* (2006.01)
*H03H 9/72* (2006.01)
(Continued)

(52) U.S. Cl.
CPC .......... *H03H 9/706* (2013.01); *H03H 9/0009* (2013.01); *H03H 9/0014* (2013.01); *H03H 9/02007* (2013.01); *H03H 9/105* (2013.01); *H03H 9/1092* (2013.01); *H03H 9/171* (2013.01); *H03H 9/205* (2013.01); *H03H 9/25* (2013.01); *H03H 9/54* (2013.01);
(Continued)

(58) Field of Classification Search
CPC ...... H03H 9/703; H03H 9/706; H03H 9/0009; H03H 9/0014; H03H 9/02007; H03H 9/105; H03H 9/1092; H03H 9/171; H03H 9/205; H03H 9/25; H03H 9/54; H03H 9/542; H03H 9/568; H03H 9/64; H03H 9/6483; H03H 9/72; H03H 9/725; H04L 5/14
See application file for complete search history.

(56) References Cited

U.S. PATENT DOCUMENTS 6,424,238 B1 7/2002 Penunuri
8,680,947 B1 3/2014 Costa et al.
(Continued)

FOREIGN PATENT DOCUMENTS

CN 102106083 6/2011
CN 102498665 8/2014
(Continued)

*Primary Examiner* — Kevin D Mew
(74) *Attorney, Agent, or Firm* — Knobbe, Martens, Olson & Bear, LLP

(57) ABSTRACT

Multiplexers are disclosed. A multiplexer can include a first filter and a second filter that are coupled to a common node. The second filter can include a first type of acoustic wave resonators (e.g., bulk acoustic wave resonators) and a series acoustic wave resonator of a second type (e.g., a surface acoustic wave resonator) that is coupled between the acoustic wave resonators of the first type and the common node. The first filter can provide a single-ended radio frequency signal. In certain embodiments, the first filter can be a receive filter and the second filter can be a transmit filter.

20 Claims, 14 Drawing Sheets

Related U.S. Application Data

(60) Provisional application No. 62/656,857, filed on Apr. 12, 2018.

(51) Int. Cl.

| | | |
|---|---|---|
| *H03H 9/54* | (2006.01) | |
| *H03H 9/205* | (2006.01) | |
| *H03H 9/64* | (2006.01) | |
| *H03H 9/02* | (2006.01) | |
| *H03H 9/00* | (2006.01) | |
| *H03H 9/10* | (2006.01) | |
| *H03H 9/17* | (2006.01) | |
| *H03H 9/25* | (2006.01) | |
| *H03H 9/56* | (2006.01) | |
| *H04L 5/14* | (2006.01) | |

(52) U.S. Cl.
CPC ............ *H03H 9/542* (2013.01); *H03H 9/568* (2013.01); *H03H 9/64* (2013.01); *H03H 9/6483* (2013.01); *H03H 9/703* (2013.01); *H03H 9/72* (2013.01); *H03H 9/725* (2013.01); *H04L 5/14* (2013.01)

(56) References Cited

U.S. PATENT DOCUMENTS

| | | | |
|---|---|---|---|
| 8,701,065 | B1 | 4/2014 | Silver et al. |
| 9,106,199 | B2 | 8/2015 | Deguet et al. |
| 9,118,303 | B2 | 8/2015 | Inoue |
| 9,219,467 | B2 | 12/2015 | Inoue et al. |
| 9,231,557 | B2 | 1/2016 | Umeda et al. |
| 9,240,622 | B2 | 1/2016 | Schmidhammer et al. |
| 9,246,533 | B2 | 1/2016 | Fujiwara et al. |
| 9,467,191 | B2 | 10/2016 | Weissman et al. |
| 9,520,857 | B2 | 12/2016 | Fujiwara et al. |
| 9,722,573 | B2 | 8/2017 | Fujiwara et al. |
| 9,866,201 | B2 | 1/2018 | Hashemi |
| 9,871,543 | B2 | 1/2018 | Analui |
| 10,249,812 | B2 | 4/2019 | Satoh |
| 11,075,616 | B2 | 7/2021 | Ando et al. |
| 11,101,787 | B2 * | 8/2021 | Ando .................... H03H 9/725 |
| 11,258,429 | B2 * | 2/2022 | Ando .................... H03H 9/703 |
| 2006/0028298 | A1 | 2/2006 | Nakamura et al. |
| 2007/0057772 | A1 | 3/2007 | Liu |
| 2007/0296521 | A1 | 12/2007 | Schmidhammer |
| 2008/0042778 | A1 | 2/2008 | Jamneala et al. |
| 2009/0009263 | A1 | 1/2009 | Javid et al. |
| 2009/0315640 | A1 | 12/2009 | Umeda et al. |
| 2010/0110940 | A1 | 5/2010 | Hara et al. |
| 2010/0244979 | A1 | 9/2010 | Matsuda et al. |
| 2011/0018653 | A1 | 1/2011 | Bradley et al. |
| 2011/0018654 | A1 | 1/2011 | Bradley et al. |
| 2011/0128092 | A1 | 6/2011 | Fritz et al. |
| 2011/0254639 | A1 | 10/2011 | Tsutsumi et al. |
| 2012/0062336 | A1 | 3/2012 | Yoshimoto |
| 2012/0154071 | A1 | 6/2012 | Bradley et al. |
| 2013/0113576 | A1 | 5/2013 | Inoue et al. |
| 2013/0127565 | A1 | 5/2013 | Nishihara et al. |
| 2013/0234806 | A1 | 9/2013 | Schmidhammer et al. |
| 2013/0271238 | A1 | 10/2013 | Onda et al. |
| 2013/0273860 | A1 | 10/2013 | Pehlke |
| 2013/0314173 | A1 | 11/2013 | Inoue |
| 2014/0018126 | A1 | 1/2014 | Asai et al. |
| 2014/0113571 | A1 | 4/2014 | Fujiwara et al. |
| 2014/0340173 | A1 | 11/2014 | Burgener et al. |
| 2015/0295559 | A1 * | 10/2015 | White .................... H03H 9/542 |
| | | | 333/133 |
| 2016/0049921 | A1 | 2/2016 | Khlat |
| 2016/0112030 | A1 | 4/2016 | Kaneda et al. |
| 2016/0156334 | A1 | 6/2016 | Nakagawa |
| 2016/0233895 | A1 | 8/2016 | Khlat |
| 2016/0294423 | A1 | 10/2016 | Yatsenko et al. |
| 2016/0380608 | A1 | 12/2016 | Ni et al. |
| 2017/0005639 | A1 | 1/2017 | Khlat et al. |
| 2017/0063404 | A1 | 3/2017 | Langer et al. |
| 2017/0099043 | A1 | 4/2017 | Goto et al. |
| 2017/0201369 | A1 | 7/2017 | Ella et al. |
| 2017/0302251 | A1 | 10/2017 | Ruby et al. |
| 2017/0331454 | A1 * | 11/2017 | Cihangir ................ H03H 9/605 |
| 2017/0331456 | A1 | 11/2017 | Ono |
| 2017/0359050 | A1 | 12/2017 | Irieda et al. |
| 2018/0048292 | A1 | 2/2018 | Hey-Shipton |
| 2018/0069529 | A1 | 3/2018 | Bi et al. |
| 2018/0123547 | A1 | 5/2018 | Kato et al. |
| 2018/0131348 | A1 | 5/2018 | Takahashi |
| 2018/0131349 | A1 | 5/2018 | Takata |
| 2018/0138892 | A1 | 5/2018 | Caron |
| 2018/0138893 | A1 | 5/2018 | Caron |
| 2018/0152172 | A1 | 5/2018 | Takeuchi |
| 2018/0152191 | A1 | 5/2018 | Niwa et al. |
| 2018/0159507 | A1 | 6/2018 | Goto et al. |
| 2018/0234076 | A1 | 8/2018 | Ando et al. |
| 2018/0234079 | A1 | 8/2018 | Takamine et al. |
| 2018/0262179 | A1 | 9/2018 | Goto et al. |
| 2019/0007006 | A1 | 1/2019 | Jo et al. |
| 2019/0181833 | A1 * | 6/2019 | Nosaka ................ H03H 7/0161 |
| 2019/0181836 | A1 | 6/2019 | Nakai et al. |
| 2019/0319605 | A1 * | 10/2019 | Ando .................... H03H 9/725 |
| 2019/0319606 | A1 * | 10/2019 | Ando .................... H03H 9/1092 |
| 2019/0319772 | A1 | 10/2019 | Ando et al. |
| 2020/0028493 | A1 * | 1/2020 | Ta ........................ H03H 7/0115 |
| 2020/0274515 | A1 * | 8/2020 | Shin .................... H03H 9/02047 |
| 2021/0075400 | A1 * | 3/2021 | Jhung .................... H03H 9/706 |
| 2021/0167752 | A1 * | 6/2021 | Caron .................... H03H 9/132 |
| 2021/0167753 | A1 * | 6/2021 | Goto .................... H03H 9/564 |

FOREIGN PATENT DOCUMENTS

| | | | |
|---|---|---|---|
| JP | 2007-037102 | 2/2007 | |
| JP | 2012-253497 | 12/2012 | |
| JP | 2013-223025 | 10/2013 | |
| JP | 2018-042192 | 3/2018 | |
| TW | 2004-15850 | 8/2004 | |
| TW | 2005-22514 | 7/2005 | |
| WO | WO-2010043687 A1 * | 4/2010 | ............ H03H 9/706 |
| WO | WO-2014032889 A1 * | 3/2014 | ............ H03H 9/706 |
| WO | WO 2018/080900 | 5/2018 | |
| WO | WO 2019/169025 | 9/2019 | |

\* cited by examiner

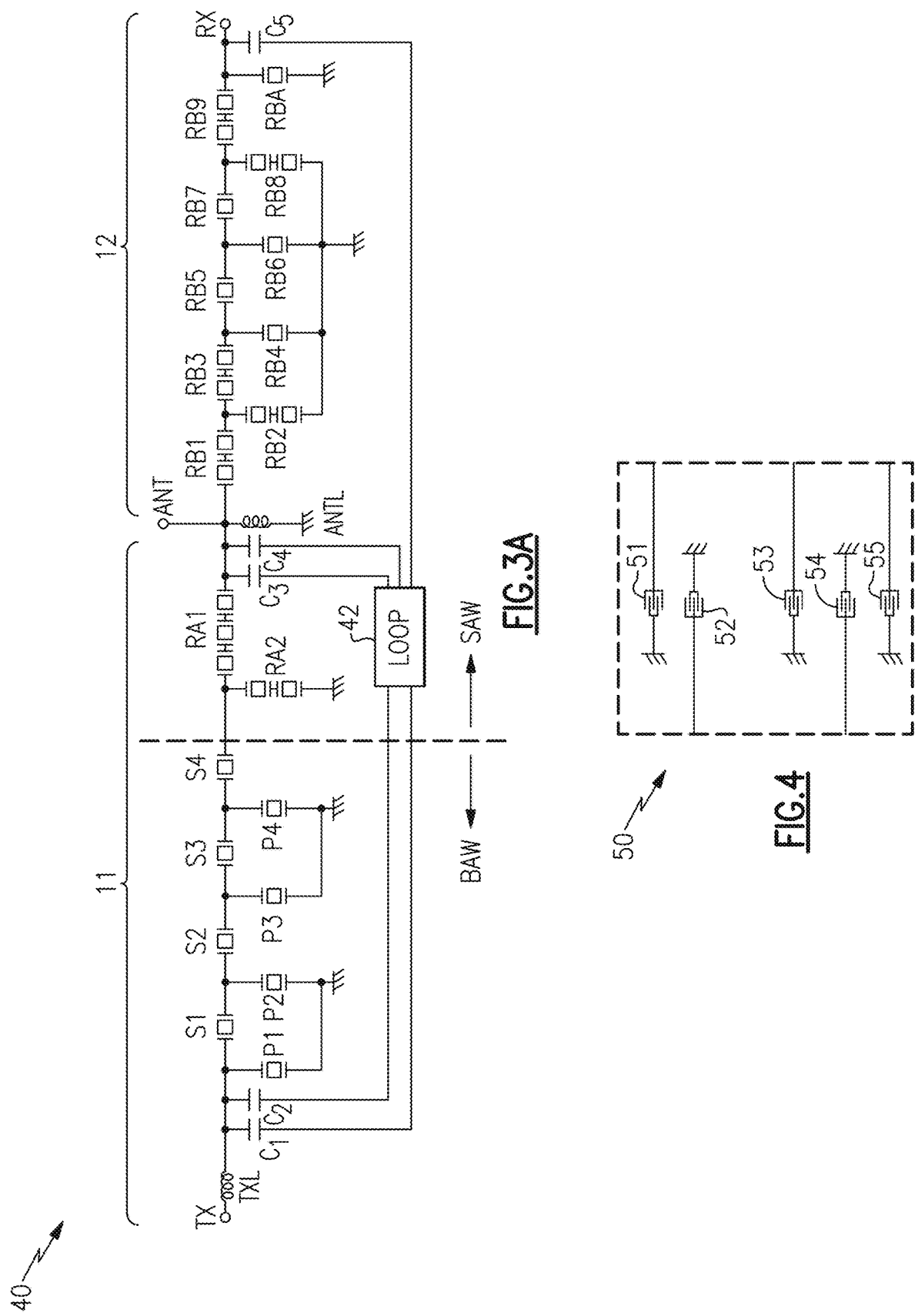

FILTER ASSEMBLY WITH TWO TYPES OF ACOUSTIC WAVE RESONATORS

CROSS REFERENCE TO PRIORITY APPLICATION

This application is a continuation of U.S. patent application Ser. No. 16/373,394, filed Apr. 2, 2019 and titled "MULTIPLEXER INCLUDING FILTER WITH TWO TYPES OF ACOUSTIC WAVE RESONATORS," which claims the benefit of priority of U.S. Provisional Patent Application No. 62/656,857, filed Apr. 12, 2018 and titled "FILTER INCLUDING TWO TYPES OF ACOUSTIC WAVE RESONATORS," the disclosure of which is hereby incorporated by reference in its entirety herein.

BACKGROUND

Technical Field

Embodiments of this disclosure relate to acoustic wave filters.

Description of Related Technology

An acoustic wave filter can include a plurality of resonators arranged to filter a radio frequency signal. Example acoustic wave filters include surface acoustic wave (SAW) filters and bulk acoustic wave (BAW) filters. A film bulk acoustic resonator (FBAR) filter is an example of a BAW filter. An acoustic wave filter can be arranged to filter a radio frequency (RF) signal.

Acoustic wave filters can be implemented in radio frequency electronic systems. For instance, filters in a radio frequency front end of a mobile phone can include acoustic wave filters. Two acoustic wave filters can be arranged as a duplexer.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

In one aspect, an acoustic wave device is disclosed. The acoustic wave device can include a transmit filter that includes bulk acoustic wave resonators and a series surface acoustic wave resonator that is coupled between the bulk acoustic wave resonators and a transmit output node. The transmit filter can be configured to filter a radio frequency signal. The acoustic wave device also includes a loop circuit that is coupled to the transmit filter. The loop circuit can be configured to generate an anti-phase signal to a target signal at a particular frequency.

In some embodiments, the acoustic wave device further includes a receive filter that includes surface acoustic wave resonators. In some embodiments, the transmit filter and the receive filter are included in a duplexer. In some embodiments, the acoustic wave device further includes a second loop circuit that is coupled to the receive filter. In some embodiments, the series surface acoustic wave resonator and at least one of the surface acoustic wave resonators are implemented on a common die. In some embodiments, the loop circuit includes another surface acoustic wave element implemented on the common die.

In some embodiments, the acoustic wave device further includes a receive filter that is configured to output a single-ended radio frequency signal, the receive filter being coupled to the loop circuit.

In one aspect, a filter assembly is disclosed. The filter assembly can include a first filter coupled to a common node, and a second filter coupled to the common node. The second filter can be configured to filter a radio frequency signal. The second filter can include acoustic wave resonators of a first type and a series acoustic wave resonator of a second type that is coupled between the acoustic wave resonators of the first type and the common node. The series acoustic wave resonator of the second type can have a higher suppression of a second harmonic of a radio frequency signal than the acoustic wave resonators of the first type. The filter assembly can also include a loop circuit that is coupled to the second filter. The loop circuit can be configured to generate an anti-phase signal to a target signal at a particular frequency.

In some embodiments, the acoustic wave resonators of the first type are bulk acoustic wave resonators and the series acoustic wave resonator of the second type is a surface acoustic wave resonator. In some embodiments, the loop circuit includes surface acoustic wave elements. In some embodiments, at least one of the surface acoustic wave elements and the series acoustic wave resonator of the second type are included on a common die.

In some embodiments, the filter assembly includes a first die that includes the acoustic wave resonators of the first type and a second die that includes the series acoustic wave resonator of the second type.

In some embodiments, the first filter includes acoustic wave resonators.

In some embodiments, the filter assembly further includes a second loop circuit that is coupled to the first filter.

In one aspect, a method of processing a radio frequency signal is disclosed. The method can include filtering a radio frequency signal with a transmit filter. The transmit filter can include bulk acoustic wave resonators and a series surface acoustic wave resonator that is coupled between the bulk acoustic wave resonators and a transmit output node of the transmit filter. The method can also include suppressing a target signal by applying, to the transmit filter, an anti-phase signal to the target signal at a particular frequency.

In some embodiments, the method further includes filtering a second radio frequency signal with a receive filter that includes surface acoustic wave resonators. In some embodiments, the transmit filter and the receive filter are included in a duplexer. In some embodiments, the series surface acoustic wave resonator and at least one of the surface acoustic wave resonators are implemented on a common die. In some embodiments, the receive filter is configured to output a single-ended radio frequency signal.

In some embodiments, the method further includes generating the anti-phase signal by a loop circuit that is coupled to the transmit filter. The loop circuit can include a surface acoustic wave element implemented on the same die as the series surface acoustic wave resonator.

In one aspect, a multiplexer is disclosed. The multiplexer can include a transmit filter that is coupled to a common node. The transmit filter can include bulk acoustic wave resonators and a series surface acoustic wave resonator that is coupled between the bulk acoustic wave resonators and the common node. The transmit filter can be configured to filter a transmit radio frequency signal. The multiplexer can also include a receive filter that is coupled to the common node. The receive filter can be configured to provide a single-ended radio frequency receive signal.

In some embodiments, the multiplexer further includes a loop circuit that is coupled to the transmit filter. The loop circuit can be configured to generate an anti-phase signal to a target signal at a particular frequency. The loop circuit can include surface acoustic wave elements. In some embodiments, the surface acoustic wave elements and the series surface acoustic wave resonator are included on a common die.

In some embodiments, the transmit filter and the receiver filter are arranged as a duplexer.

In some embodiments, the transmit filter includes a shunt surface acoustic wave resonator that is coupled to a node between the bulk acoustic wave resonators and the common node.

In some embodiments, the bulk acoustic wave resonators of the transmit filter are at least 80% of resonators of the transmit filter.

In some embodiments, the receive filter includes surface acoustic wave resonators.

In some embodiments, the series surface acoustic wave resonator is coupled between all bulk acoustic wave resonators of the transmit wave filter and the common node.

In some embodiments, the multiplexer further includes two filters coupled to the common node. The multiplexer can be configured as a quadplexer.

In one aspect, a filter assembly is disclosed. The filter assembly can include a first filter that is coupled to a common node. The first filter can be configured to provide a single-ended radio frequency output signal. The filter assembly can also include a second filter that is coupled to the common node and configured to filter a radio frequency signal. The second filter can include acoustic wave resonators of a first type and a series acoustic wave resonator of a second type that is coupled between the acoustic wave resonators of the first type and the common node. The series acoustic wave resonator of the second type can have a higher suppression of a second harmonic of a radio frequency signal than the acoustic wave resonators of the first type.

In some embodiments, the acoustic wave resonators of the first type are bulk acoustic wave resonators and the series acoustic wave resonator of the second type is a surface acoustic wave resonator. In some embodiments, the bulk acoustic wave resonators and the series acoustic wave resonator are implemented on a common filter die and enclosed within a common cap.

In some embodiments, the filter assembly includes a first die that includes the acoustic wave resonators of the first type and a second die that includes the series acoustic wave resonator of the second type.

In some embodiments, the first filter includes acoustic wave resonators of the first type.

In some embodiments, the filter assembly further includes a loop circuit that is coupled to the second filter. The loop circuit can be configured to generate an anti-phase signal to a target signal at a particular frequency. In some embodiments, the loop circuit includes acoustic wave elements on the same die as the acoustic wave resonators of the second type. In some embodiments, the first filter is a receive filter, the second filter is a transmit filter, and the first filter and the second filter are included in a duplexer.

In one aspect a wireless communication device is disclosed. The wireless communication device can include an antenna and a multiplexer that is coupled to the antenna. The multiplexer can include a receive filter that is configured to provide a single-ended radio frequency receive signal. The multiplexer can also include a transmit filter that includes bulk acoustic wave resonators and a series surface acoustic wave resonator that is coupled between the bulk acoustic wave resonators and the antenna. The transmit filter can be configured to filter a transmit radio frequency signal.

In some embodiments, the wireless communication device further includes a loop circuit that is coupled to the transmit filter. The loop circuit can be configured to generate an anti-phase signal to a target signal at a particular frequency.

In some embodiments, the transmit filter and the receiver filter are arranged as a duplexer, and the receive filter includes surface acoustic wave resonators.

In one aspect, an acoustic wave device is disclosed. The acoustic wave device can include a transmit filter that includes bulk acoustic wave resonators and a series surface acoustic wave resonator that is coupled between the bulk acoustic wave resonators and a transmit output node. The acoustic wave device can also include a receive filter that includes surface acoustic wave resonators. The receive filter can be coupled to the transmit filter at a common node. The transmit filter and the receive filter can be included in a multiplexer. The acoustic wave device can also include a loop circuit that is coupled to the receive filter. The loop circuit can be configured to generate an anti-phase signal to a target signal at a particular frequency.

In some embodiments, the multiplexer is a duplexer.

In some embodiments, the acoustic wave device further includes a second loop circuit coupled to the transmit filter.

In some embodiments, the series surface acoustic wave resonator and at least one of the surface acoustic wave resonators are implemented on a common die. In some embodiments, the loop circuit includes a surface acoustic wave element implemented on the common die.

In some embodiments, the receive filter is configured to output a single-ended radio frequency signal.

In one aspect, a filter assembly is disclosed. The filter assembly can include a first filter that is coupled to a common node and a second filter that is coupled to the common node. The second filter can be configured to filter a radio frequency signal. The second filter can include acoustic wave resonators of a first type and a series acoustic wave resonator of a second type that is coupled between the acoustic wave resonators of the first type and the common node. The series acoustic wave resonator of the second type can have a higher suppression of a second harmonic of a radio frequency signal than the acoustic wave resonators of the first type. The filter assembly can also include a loop circuit that is coupled to the first filter. The loop circuit can be configured to generate an anti-phase signal to a target signal at a particular frequency.

In some embodiments, the acoustic wave resonators of the first type are bulk acoustic wave resonators and the series acoustic wave resonator of the second type is a surface acoustic wave resonator.

In some embodiments, the filter assembly includes a first die that includes the acoustic wave resonators of the first type and a second die that includes the series acoustic wave resonator of the second type.

In some embodiments, the first filter includes acoustic wave resonators.

In some embodiments, the filter assembly further includes a second loop circuit coupled to the second filter. In some embodiments, the loop circuit includes acoustic wave resonators of the second type. In some embodiments, the acoustic wave resonators of the second type and the series acoustic wave resonator of the second type are included on a common die.

In some embodiments, the first filter is configured to output a single-ended radio frequency signal In one aspect, a method of processing a radio frequency signal is disclosed. The method can include filtering a transmit radio frequency signal with a transmit filter. The transmit filter can include bulk acoustic wave resonators and a series surface acoustic wave resonator that is coupled between the bulk acoustic wave resonators and a transmit output node. The method can also include filtering a receive radio frequency signal with a receive filter. The receive filter can include acoustic wave resonators. The method can further include suppressing a target signal by applying, to the receive filter, an anti-phase signal to the target signal at a particular frequency.

In some embodiments, the acoustic wave resonators of the receive filter include surface acoustic wave resonators. In some embodiments, the series surface acoustic wave resonator and at least one of the surface acoustic wave resonators are implemented on a common die.

In some embodiments, the transmit filter and the receive filter are included in a duplexer.

In some embodiments, the receive filter is configured to output a single-ended receive radio frequency signal.

In some embodiments, the suppressing includes generating the anti-phase signal by a loop circuit coupled to the transmit filter.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 16/373,426, titled "FILTER INCLUDING TWO TYPES OF ACOUSTIC WAVE RESONATORS," filed on even date herewith, the entire disclosure of which is hereby incorporated by reference herein. The present disclosure relates to U.S. patent application Ser. No. 16/374,340, titled "ACOUSTIC WAVE FILTER INCLUDING TWO TYPES OF RESONATORS" filed on even date herewith, the entire disclosure of which is hereby incorporated by reference herein.

BRIEF DESCRIPTION OF THE DRAWINGS

Embodiments of this disclosure will be described, by way of non-limiting example, with reference to the accompanying drawings.

FIG. 3A is a schematic diagram of a duplexer with a loop circuit and a transmit filter that includes BAW resonators and SAW resonators according to an embodiment.

FIG. 4 is a schematic diagram of resonators of an example loop circuit of FIG. 3A.

DETAILED DESCRIPTION OF CERTAIN EMBODIMENTS

Figure 1A:
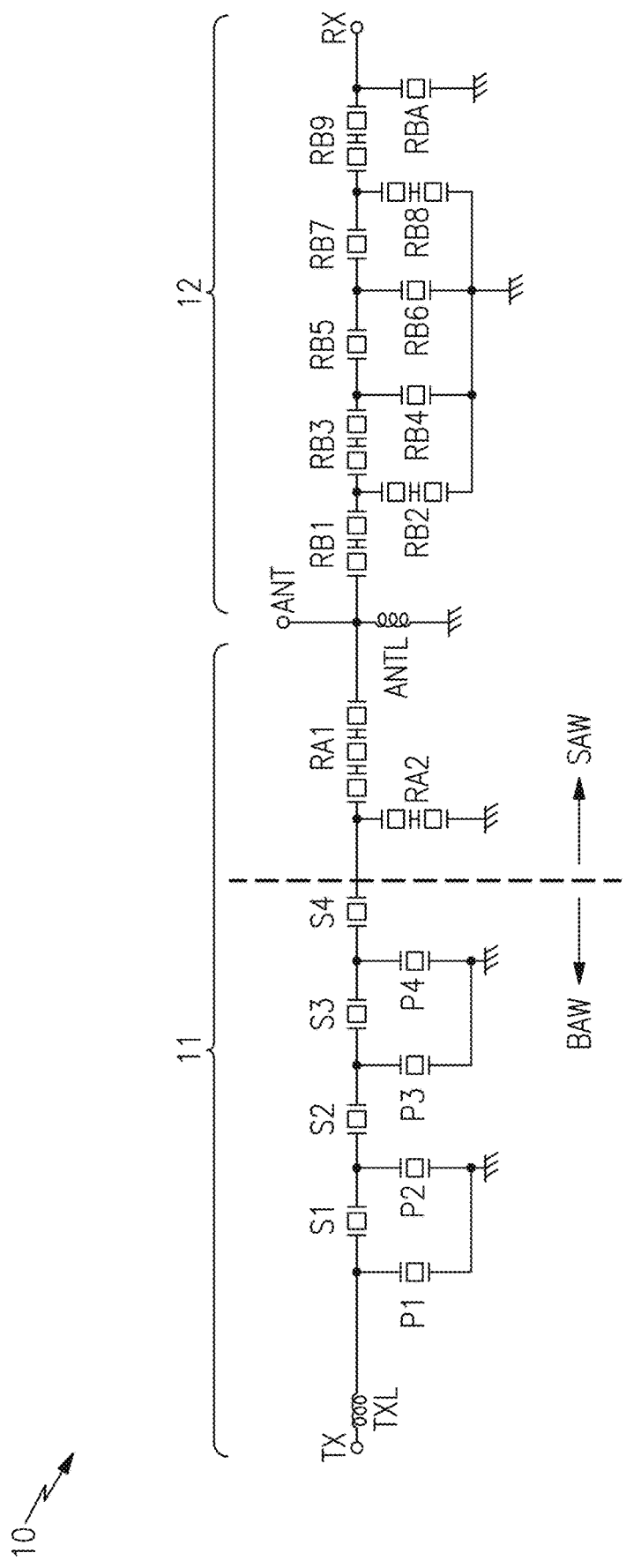
FIG. 1A is a schematic diagram of a duplexer with a transmit filter that includes bulk acoustic wave (BAW) resonators and surface acoustic wave (SAW) resonators according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A radio frequency front end can include a duplexer that includes a transmit filter and a receive filter. The transmit filter can be coupled between a transmit path and an antenna. The receive filter can be coupled between a receive path and the antenna. A common node of the duplexer can couple both the transmit filter and the receive filter to the antenna.

Some duplexers can include a transmit filter that includes bulk acoustic wave (BAW) resonators arranged as a ladder filter and a receive filter that includes surface acoustic wave (SAW) resonators arranged as another ladder filter. In such duplexers, a second-order distortion of the BAW resonators of the transmit filter can cause transmit harmonics and/or antenna mismatches.

Aspects of this disclosure relate to a transmit filter that includes BAW resonators and a SAW resonator coupled between the BAW resonators and a transmit output node of the transmit filter. The transmit filter can have a reduced second harmonic distortion relative to a transmit filter that includes only BAW resonators. The SAW resonator of the transmit filter can be part of the same chip as SAW resonators of a receive filter of a duplexer that includes the transmit filter and the receive filter. This can improve antenna matching. A loop circuit can be included as part of the duplexer. The loop circuit can improve stability of the duplexer and/or suppress noise. The receive filter can output a single-ended radio frequency signal. The loop circuit can be less complex and/or more effective with a receive filter arranged to output a single-ended radio frequency signal compared to a received filter arranged to output a differential radio frequency signal.

FIG. 1A is a schematic diagram of a duplexer 10 according to an embodiment. The duplexer 10 includes a transmit filter 11 and a receive filter 12 coupled to each other at an antenna node ANT. A shunt inductor ANTL can be connected to the antenna node ANT. The transmit filter 11 and the receive filter 12 are both acoustic wave ladder filters in the duplexer 10. The transmit filter 11 and the receive filter 12 can filter radio frequency signals. As an example, these filters can filter a Band 7 signal in which a transmit filter 11 can filter a signal having a frequency in a range from 2500 MHz to 2570 MHz and the receive filter can filter a signal having a frequency in a range from 2620 MHz to 2690 MHz.

The receive filter 12 can be implemented by SAW resonators RB1, RB2, RB3, RB4, RB5, RB6, RB7, RB8, RB9, and RBA. Accordingly, the receive filter 12 can be referred to as a SAW filter. The receive filter 12 can filter a radio frequency signal received at the antenna node ANT. The receive output node RX of the receive filter 12 can provide a single-ended radio frequency receive signal.

The transmit filter 11 can filter a radio frequency signal and provide a filtered radio frequency signal to the antenna node ANT. A series inductor TXL can be coupled between the transmit input node TX and the acoustic wave resonators of the transmit filter 11. The transmit filter 11 can suppress second order harmonics. The transmit filter 11 includes BAW resonators S1, S2, S3, S4, P1, P2, P3, and P4 and SAW resonators RA2 and RA1. Accordingly, the transmit filter 11 can be referred to as a hybrid BAW and SAW transmitter filter. The illustrated transmit filter 11 includes a series SAW resonator RA1 at a final stage of the transmit filter 11. As illustrated, the transmit filter 11 includes BAW resonators and a series SAW resonator RA1, in which the series SAW resonator RA1 is coupled between the BAW resonators and a transmit output node or the antenna node ANT. The illustrated transmit filter 11 also includes a shunt SAW resonator RA2 coupled at a node between the BAW resonators of the transmit filter 11 and the antenna node ANT. Any suitable number of SAW resonators can be coupled between BAW resonators of the transmit filter and the antenna node ANT. For instance, a series SAW resonator and one or more other series SAW resonators and/or one or more shunt SAW resonators can be coupled between BAW resonators of the transmit filter and the antenna node ANT.

When a transmit filter is composed only of BAW resonators in a duplexer that also includes a receive filter with only SAW resonators, harmonics characteristics can deteriorate due to second order distortion caused by asymmetry. In the duplexer 10, by using the SAW resonator at the final stage of transmit filter 11, the second order distortion and deterioration of the harmonic characteristic can be suppressed. In addition, by incorporating the series SAW resonator of the transmit filter 11 in the same SAW chip as SAW resonators of the receive filter 12, antenna matching can be improved relative to other duplexers.

Figure 1B:
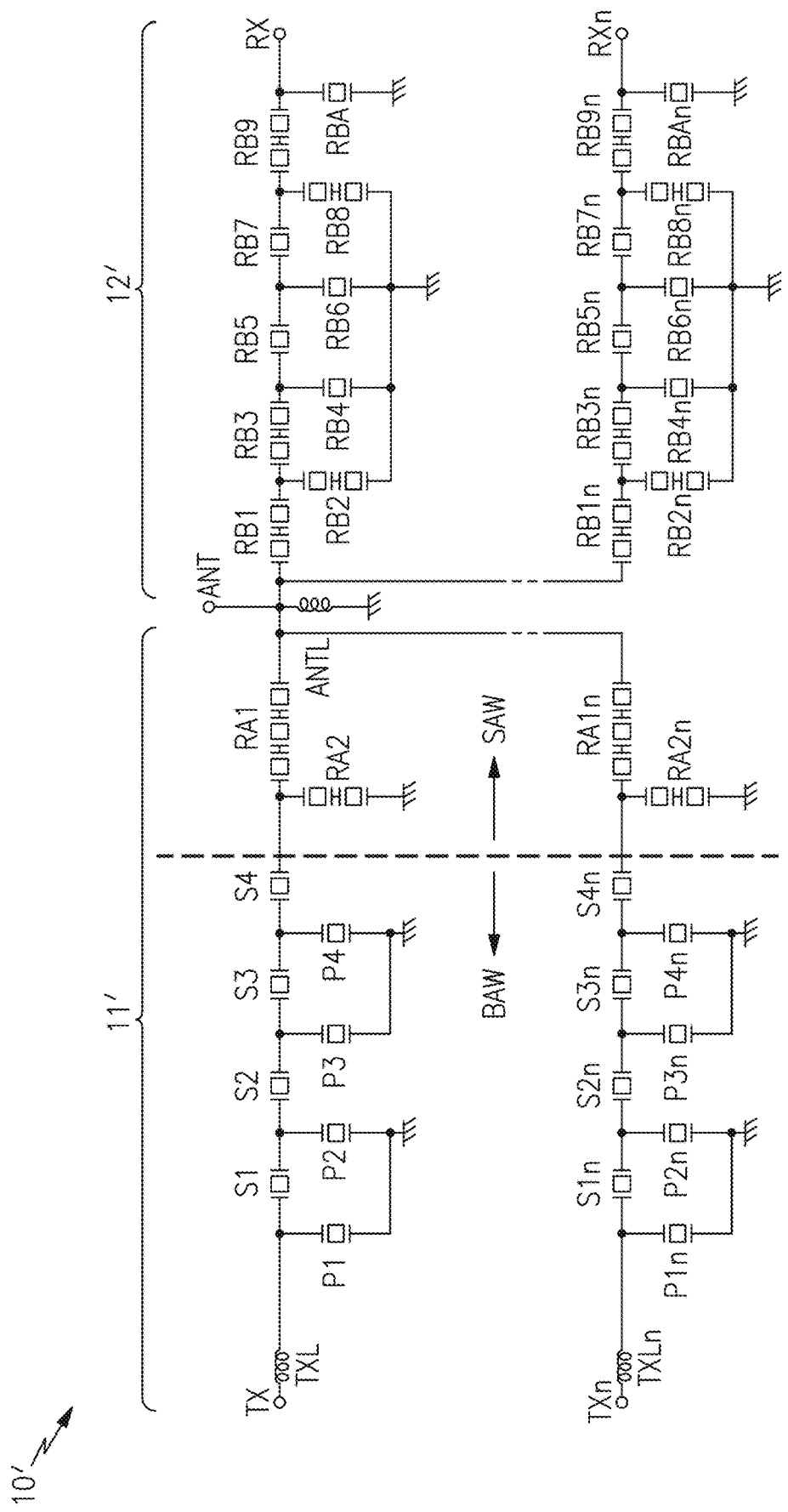
FIG. 1B is a schematic diagram of a multiplexer with a transmit filter that includes BAW resonators and SAW resonators according to an embodiment.

FIG. 1B is a schematic diagram of a multiplexer 10' according to an embodiment. The multiplexer 10' includes transmit filters 11' and filters 12' coupled to each other at an antenna node ANT. The illustrated multiplexer 10' includes a first transmit filter, a first receive filter, nth transmit filter, and nth receive filter. In some embodiments, the number of transmit filters 11' and the number of receive filters 12' may be different.

Each of the transmit filters 11' can have the same or generally similar structure as the transmit filter 11 of FIG. 1A. Similarly, each of the receive filters 12' can have the same or generally similar structure as the receive filter 12 of FIG. 1A. The two illustrated transmit filters of the transmit filters 11' and the two illustrated receive filters of the receive filters 12' illustrated in FIG. 1B include the same SAW resonator and BAW resonator topology. For example, the first transmit filter and the first receive filter of the multiplexer 10' can correspond to the transmit filter 11 and the receive filter 12, respectively, of FIG. 1A. The second receive filter of the multiplexer 10' can include SAW resonators RB1$n$, RB2$n$, RB3$n$, RB4$n$, RB5$n$, RB6$n$, RB7$n$, RB8$n$, RB9$n$, and RBA$n$ and provide a single-ended radio frequency signal at receive output node RX$n$. The second transmit filter of the multiplexer 10' include a series inductor TXL$n$ coupled between a transmit input node TX$n$ and the acoustic wave resonators of the second transmit filter. As illustrated, the acoustic wave resonators of the second transmit filter include BAW resonators S1$n$, S2$n$, S3$n$, S4$n$, P1$n$, P2$n$, P3$n$, and P4$n$ and SAW resonators RA2$n$ and RA1$n$. However, in other embodiments, one or more of the transmit filters 11' can include different resonator topology including different numbers and/or different combinations of SAW and BAW resonators. Similarly, the receive filters 12' can include different resonator topologies.

Figure 2:
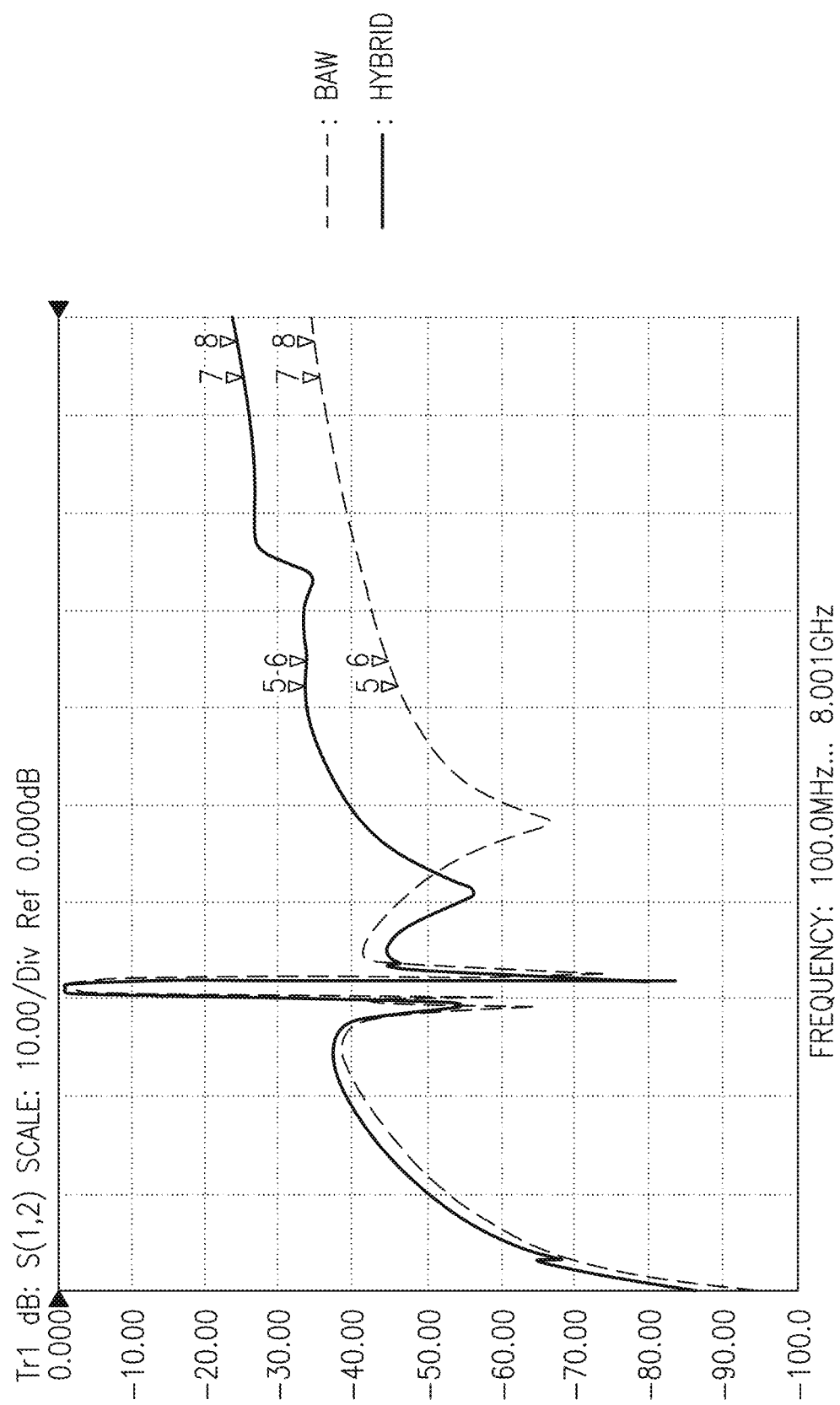
FIG. 2 is a graph that compares performance of the transmit filter of FIG. 1A to a corresponding transmit filter in which all acoustic wave resonators are BAW resonators.

FIG. 2 is a graph that compares performance of the transmit filter 10 of FIG. 1A to a corresponding transmit filter in which all acoustic wave resonators are BAW resonators. The graph shows that the filter 10 of FIG. 1A suppresses the second order distortion and deterioration of the harmonic characteristic compared to the corresponding BAW resonator only transmit filter.

FIG. 3A is a schematic diagram of a duplexer 40 with a loop circuit 42 according to an embodiment. The duplexer 40 is like the duplexer 10 of FIG. 1A except that the duplexer 40 includes the loop circuit 42. The duplexer 40 also includes capacitors C1, C2, C3, C4, and C5 that couple the resonators of the loop circuit 42 to the transmit filter 11 and/or the receive filter 12. The illustrated capacitors C1, C2, C3, C4, and C5 can function as attenuation elements. In some other implementations, a different attenuation element, such as a resistor and/or an inductor, can alternatively or additionally be included with any embodiment disclosed herein as suitable. The capacitors C1, C2, C3, C4, and C5 and/or other attenuation elements can be considered part of a loop circuit in certain instances.

The illustrated loop circuit 42 is coupled to the transmit filter 11. The loop circuit 42 can be coupled to an input resonator S1 and an output resonator RA1 of the transmit filter 11. In some other instances, the loop circuit 42 can be coupled to a different node or nodes of the ladder circuit of the transmit filter 11 than illustrated. The loop circuit 42 can include SAW elements, such as SAW resonators and/or SAW delay lines. One or more SAW elements of the loop circuit 42 can be on the same die as one or more SAW resonators of the transmit filter 11 and/or the receive filter 12. The loop circuit 42 can improve receive isolation and/or carrier aggregation band attenuation.

The loop circuit 42 can suppress and/or cancel an unwanted frequency component. The loop circuit 42 can enhance transmit/receive isolation and attenuation for a particular frequency range. The loop circuit 42 can apply a cancelation signal to the transmit filter 11, in which the cancelation signal has approximately the same amplitude and an opposite phase to a signal component to be canceled. The loop circuit 42 can apply a signal having approximately the same amplitude and an opposite phase to a signal component to be canceled. The loop circuit 42 can apply the signal having approximately the same amplitude and an opposite phase to a signal component to be canceled to the transmit filter 11. The loop circuit 42 can be implemented in accordance with any suitable principles and advantages described in U.S. Pat. No. 9,246,533 and/or U.S. Pat. No. 9,520,857, the disclosures of these patents are hereby incorporated by reference in their entireties herein.

In a duplexer with a BAW only transmit filter and a SAW only receive filter, a loop circuit connecting portion at an antenna terminal can be a chip boundary. Accordingly, there is a possibility that noise due to connections between chips may occur. In the circuit configuration of FIG. 3A, a SAW resonator of the final stage of the transmit filter 11 and a SAW resonator of the receive filter coupled to the antenna node ANT can be side by side on the same die. Such SAW resonators can also be disposed on the same die as the SAW elements of the loop circuit 42. As such, noise and/or other distortion due to a connection between chips can be insignificant.

The loop circuit 42 can work better with a single-ended radio frequency receive signal than with a differential radio frequency receive signal. For example, the loop circuit 42 with a single-ended radio frequency receive signal can suppress an unwanted frequency more efficiently and/or with fewer circuit elements than when the loop circuit 42 is used with a differential radio frequency receive signal.

Figure 3B:
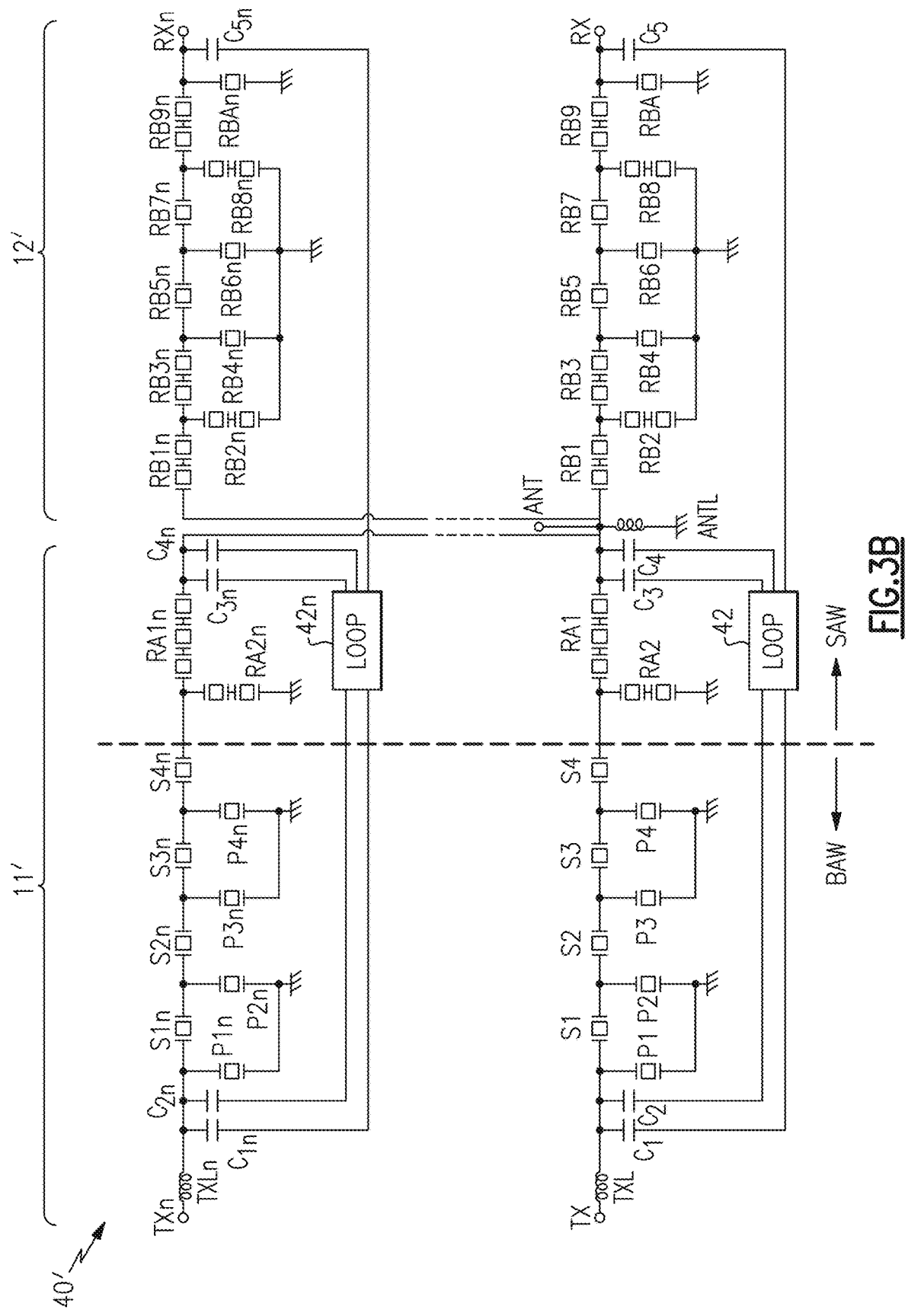
FIG. 3B is a schematic diagram of a multiplexer with loop circuits and transmit filters that each include BAW resonators and SAW resonators according to an embodiment.

FIG. 3B is a schematic diagram of a multiplexer 40' with loop circuits 42 and 42n according to an embodiment. The multiplexer 40' is like the multiplexer 10' of FIG. 1B except that the multiplexer 40' includes the loop circuits 42 and 42n. The multiplexer 40' also includes capacitors C1, C2, C3, C4, and C5 that couple the elements of the loop circuit 42 to a first transmit filter of the transmit filters 11' and/or a first receive filter of the receive filters 12'. Similarly, the multiplexer 40' includes capacitors C1n, C2n, C3n, C4n, and C5n that couple the elements of the loop circuit 42n to a second transmit filter of the transmit filters 11' and/or a second receive filter of the receive filters 12'. The loop circuits 42 and 42n can be similar or substantially the same in certain embodiments. According to some other embodiments the loop circuits 42 and 42n can be implemented differently.

Figure 3C:
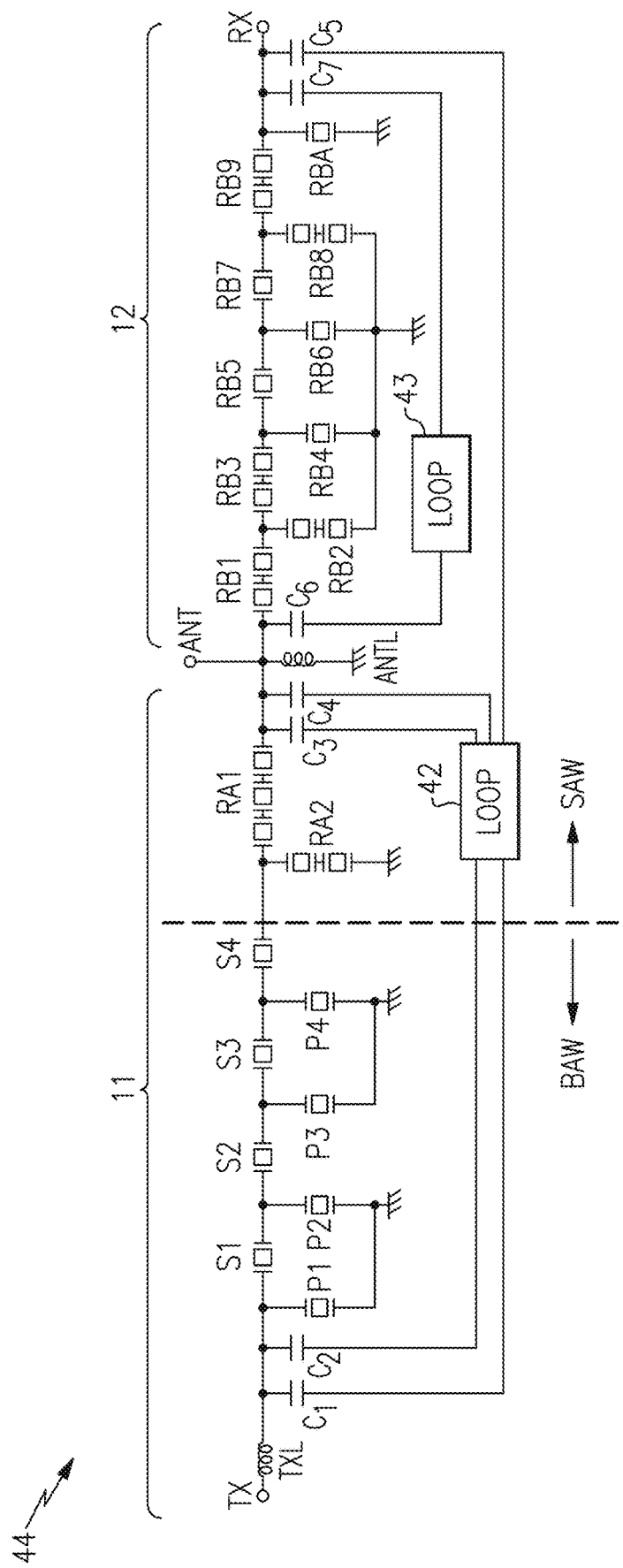
FIG. 3C is a schematic diagram of a duplexer with a loop circuit coupled a transmit filter that includes BAW resonators and SAW resonators and another loop circuit coupled to a receive filter according to an embodiment.

FIG. 3C is a schematic diagram of a duplexer 44 with loop circuits 42 and 43 according to an embodiment. The duplexer 44 is like the duplexer 40 of FIG. 3A except that the duplexer 44 additionally includes the loop circuit 43. The duplexer 44 also includes capacitors C1, C2, C3, C4, C5, C6, and C7 that couple the elements of the loop circuits 42, 43 to the transmit filter 11 and/or the receive filter 12. In some embodiments, the loop circuit 43 can also be coupled to a node between the transmit input node TX and the BAW resonators of the transmit filter 11. The loop circuit 43 can apply a cancelation signal to the receive filter 12, in which the cancelation signal has approximately the same amplitude and an opposite phase to a signal component to be canceled.

The illustrated loop circuit 42 is coupled to the transmit filter 11, and the illustrated loop circuit 43 is coupled to the receive filter 12. The loop circuit 42 can be coupled to an input resonator S1 and an output resonator RA1 of the transmit filter 11. In some other instances, the loop circuit 42 can be coupled to a different node or nodes of the ladder circuit of the transmit filter 11 than illustrated. The loop circuit 43 can be coupled to an input resonator RB1 and an output resonator RB9 of the receive filter 12. In some other instances, the loop circuit 43 can be coupled to a different node or nodes of the ladder circuit of the receive filter 12 than illustrated.

The loop circuits 42, 43 can include SAW elements, such as SAW resonators and/or delay lines. One or more SAW elements of the loop circuit 42 can be on the same die as one or more SAW resonators of the transmit filter 11 and/or the receive filter 12. Similarly, one or more SAW elements of the loop circuit 43 can be on the same die as one or more SAW resonators of the transmit filter 11 and/or the receive filter 12. The loop circuits 42, 43 can improve receive isolation and/or carrier aggregation band attenuation.

As with the loop circuit 42 explained above with respect to FIG. 3A, the loop circuit 43 can suppress and/or cancel an unwanted frequency component. The loop circuit 43 can enhance transmit/receive isolation and attenuation for a particular frequency range. The loop circuit 43 can apply a signal having approximately the same amplitude and an opposite phase to a signal component to be canceled. The loop circuit 43 can be implemented in accordance with any suitable principles and advantages described in U.S. Pat. No. 9,246,533 and/or U.S. Pat. No. 9,520,857, for example.

Figure 3D:
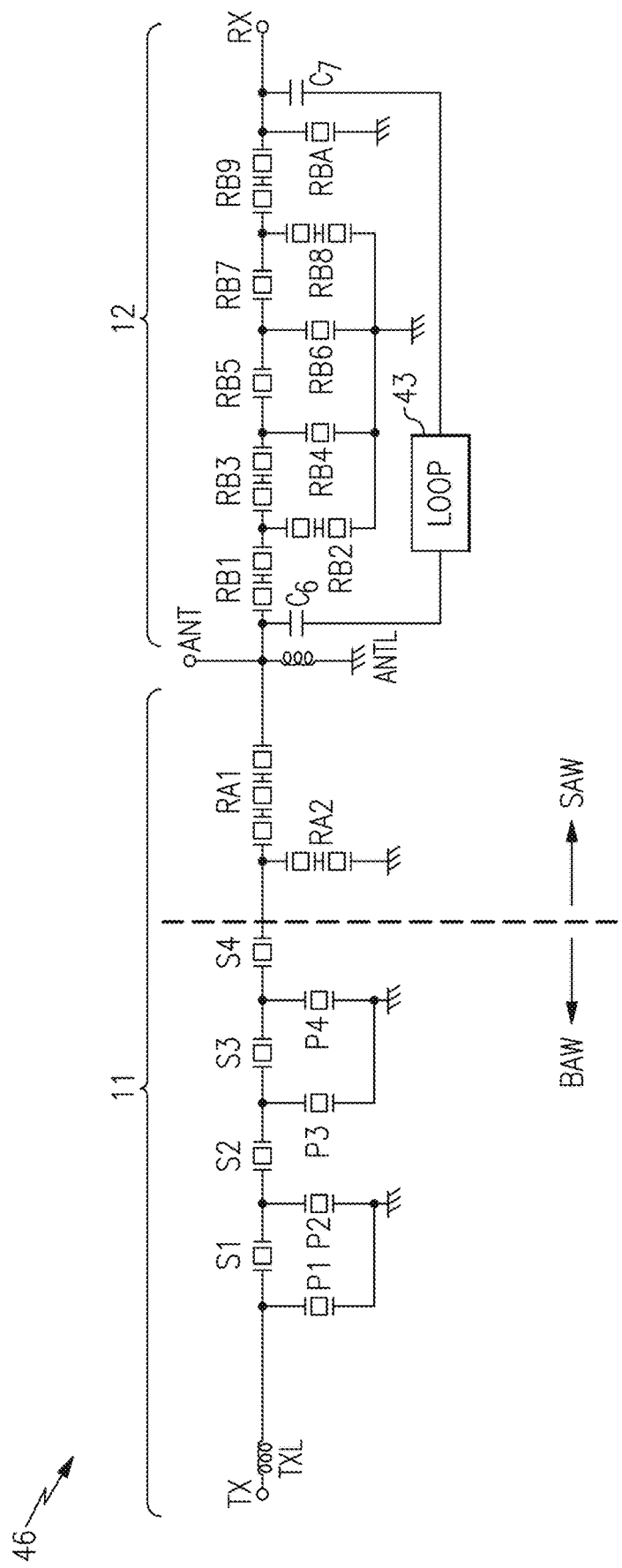
FIG. 3D is a schematic diagram of a duplexer with a transmit filter that includes BAW resonators and SAW resonators and a loop circuit coupled to a receive filter according to an embodiment.

FIG. 3D is a schematic diagram of a duplexer 46 with loop circuit 43 according to an embodiment. The duplexer 46 is like the duplexer 44 of FIG. 3C except that the duplexer 46 does not include the loop circuit 42 illustrated in FIG. 3C. The duplexer 46 also includes capacitors C6 and C7 that couple the elements of the loop circuit 43 to the receive filter 12. In the illustrated embodiment, the capacitor C6 is coupled between the antenna node ANT and the SAW resonator RB1 and the capacitor C7 is coupled between the SAW resonator RB9 and receive output node RX. The duplexer 46 can be implemented in situations where suppression and/or cancelation of an unwanted frequency component is desired in a receive filter of a duplexer and where duplexers specifications can be met without a loop circuit for the transmit filter 11.

Figure 3E:
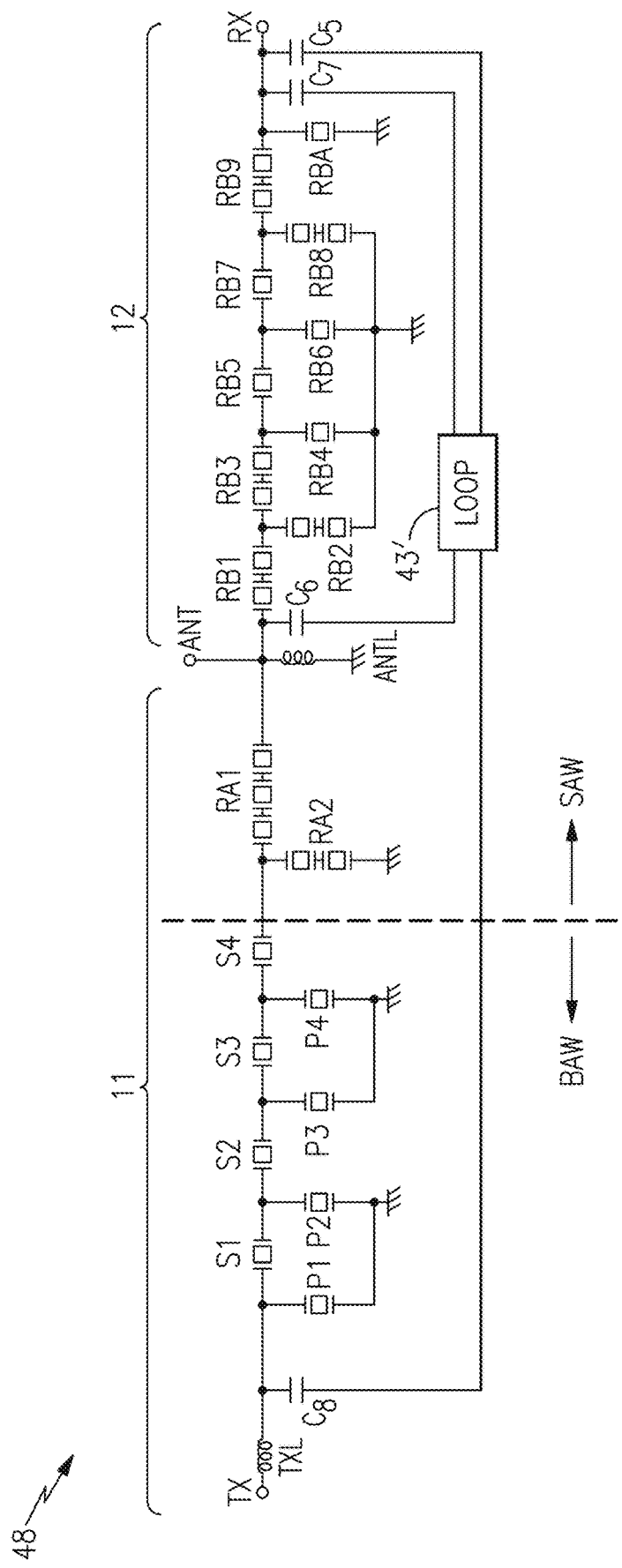
FIG. 3E is a schematic diagram of a duplexer with a transmit filter that includes BAW resonators and SAW resonators and a loop circuit coupled to a receive filter according to another embodiment.

FIG. 3E is a schematic diagram of a duplexer 48 with loop circuit 43' according to an embodiment. The duplexer 48 is like the duplexer 46 of FIG. 3D except that the loop circuit 43' of the duplexer 48 is also coupled to a node between the transmit input node TX and the BAW resonator S1. The elements of the loop circuit 43' can also be different than the elements of the loop circuit 43. The duplexer 48 also includes capacitors C5, C6, C7, and C8 that couple the elements of the loop circuit 43 to the transmit filter 11 and/or the receive filter 12.

FIG. 4 is a schematic diagram of resonators of an example loop circuit 50. The loop circuit 50 is an example of the loop circuit 42 of FIGS. 3A, 3B, and 3C, the loop circuit 43 of FIGS. 3C and 3D, and/or the loop circuit 43' of FIG. 3E. The illustrated loop circuit 50 includes SAW elements 51, 52, 53, 54, and 55. As illustrated, the SAW elements each include an interdigital transducer electrode.

While FIGS. 1A, 3A and 3C-3E illustrate example duplexers that include SAW resonators and BAW resonators and FIGS. 1B and 3B illustrate other example multiplexers that include SAW resonators and BAW resonators, any suitable principles and advantages discussed herein can be implemented by different suitable types of acoustic wave resonators. For instance, a filter of a duplexer can include acoustic wave resonators of a first type and a series acoustic wave resonator of a second type coupled between the acoustic wave resonators of the first type and a common node of the duplexer. The second type of acoustic wave resonator can have a higher suppression of a second harmonic of a radio frequency signal than the first type of acoustic wave resonator. For example, in the duplexer 10 of FIG. 1A and the duplexer 40 of FIG. 3A, the first type of resonator is a BAW resonator and the second type of resonator is a SAW resonator. In some instances, the first type of resonator can be a BAW resonator and the second type of resonator can be a boundary acoustic wave resonator.

Figure 5:
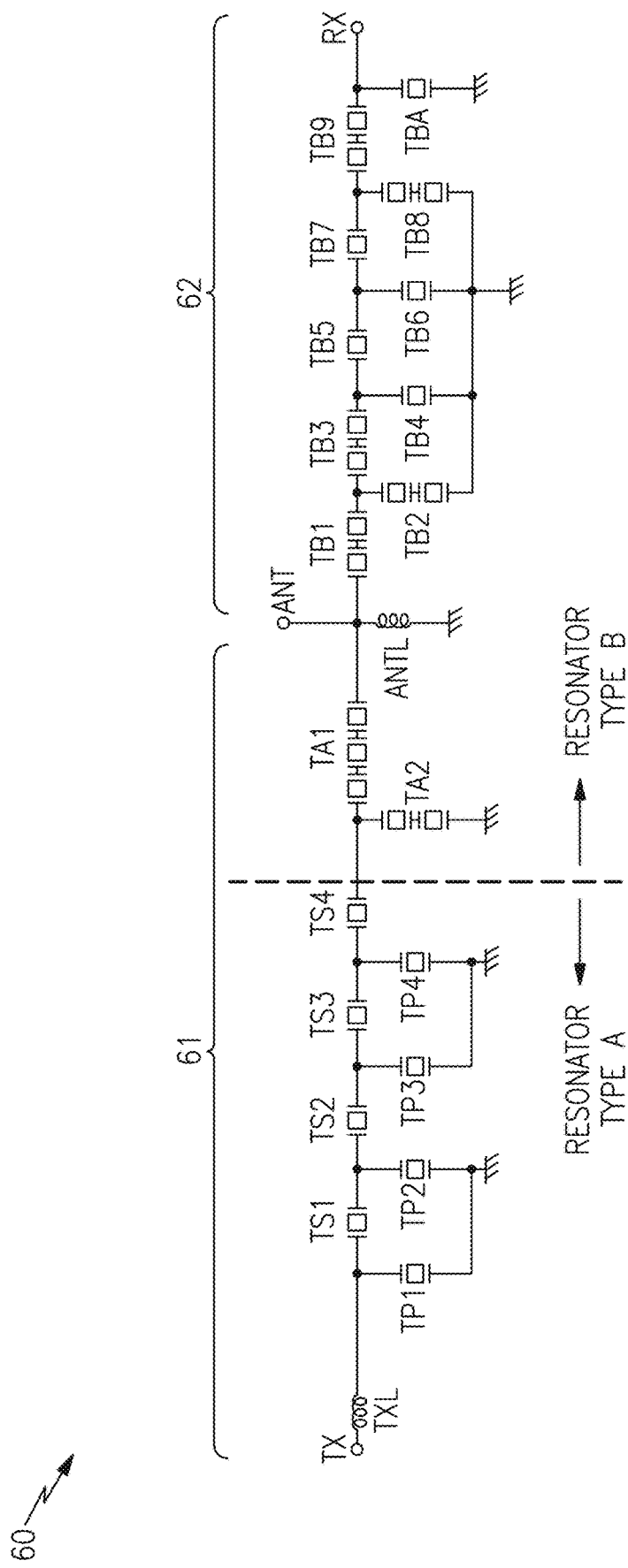
FIG. 5 is a schematic diagram of a duplexer with a transmit filter that includes two types of resonators according to an embodiment.

FIG. 5 is a schematic diagram of a duplexer 60 with a transmit filter 61 that includes two types of resonators according to an embodiment. The duplexer 60 also includes a receive filter 62. The duplexer 60 includes a first type of acoustic wave resonators and a second type of acoustic wave resonators. The second type of acoustic wave resonators can have a higher suppression of a second harmonic of a radio frequency signal than the first type of acoustic wave resonators. The duplexer 10 of FIG. 1A is an example of the duplexer 60 in which the first type of acoustic wave resonator is a BAW resonator and the second type of acoustic wave resonator is a SAW resonator.

The transmit filter 61 and the receive filter 62 can filter radio frequency signals. The transmit filter 61 includes second type resonators TS1, TS2, TS3, TS4, TP1, TP2, TP3, and TP4 and first type resonators TA2 and TA1. The receive filter 62 can be implemented by first type resonators TB1, TB2, TB3, TB4, TB5, TB6, TB7, TB8, TB9, and TBA. The receive filter 62 can filter a radio frequency signal received at the antenna node ANT. The receive output node RX of the receive filter 62 can provide a single-ended radio frequency receive signal.

When a transmit filter is composed only of second type resonators in a duplexer that also includes a receive filter with only first type resonators, harmonics characteristics can deteriorate due to second order distortion caused by asymmetry. In the duplexer 60, by using the first type resonator at the final stage of transmit filter 61, the second order distortion and deterioration of the harmonics characteristic can be suppressed. In addition, by incorporating the series first type resonator of the transmit filter 61 in the same first type resonator chip as first type resonators of the receive filter 62, antenna matching can be improved relative to other duplexers.

Figure 6A:
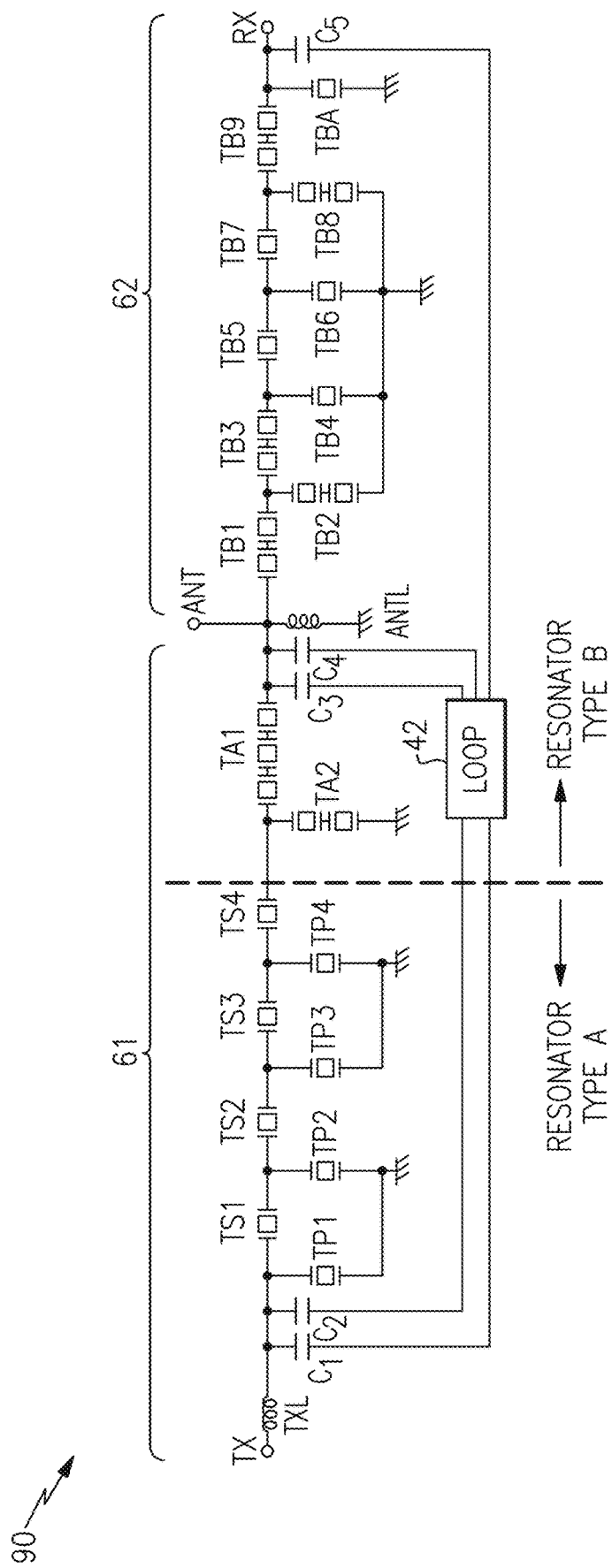
FIG. 6A is a schematic diagram of a duplexer with a loop circuit and a transmit filter that includes two types of resonators according to an embodiment.

FIG. 6A is a schematic diagram of a duplexer 90 with a loop circuit 42 according to an embodiment. The duplexer 90 is like the duplexer 60 of FIG. 5 except that the duplexer 90 includes the loop circuit 42. The duplexer 90 also includes capacitors C1, C2, C3, C4, and C5 that couple resonators of the loop circuit 42 to the transmit filter 61 and/or the receive filter 62. The loop circuit 42 of the duplexer 90 can implement any suitable principles and advantages of any of the loop circuits discussed herein.

Figure 6B:
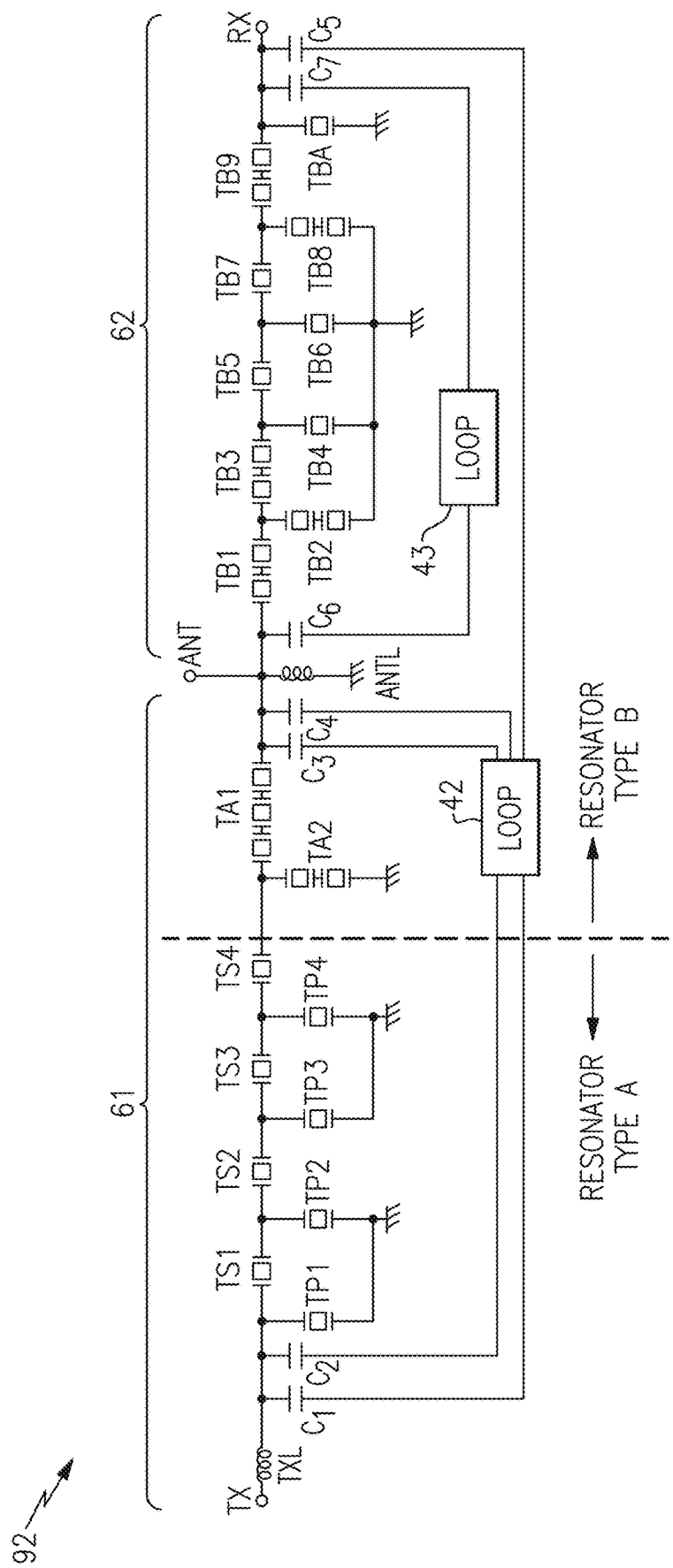
FIG. 6B is a schematic diagram of a duplexer with a loop circuit coupled to a transmit filter that includes two types of resonators and another loop circuit coupled to a receive filter according to an embodiment.

FIG. 6B is a schematic diagram of a duplexer 92 with a loop circuits 42, 43 according to an embodiment. The duplexer 92 is like the duplexer 90 of FIG. 6A except that the duplexer 92 includes the loop circuit 43. The duplexer 92 includes capacitors C1, C2, C3, C4, C5, C6, and C7 that couple elements of the loop circuits 42, 43 to the transmit filter 61 and/or the receive filter 62. The loop circuit 43 of the duplexer 92 can implement any suitable principles and advantages of any of the loop circuits discussed herein.

Although some embodiments discussed herein may be described with reference to duplexers, any suitable principles and advantages discussed herein can be applied to multiplexers, for example, as discussed in FIGS. 1B and 3B. A multiplexer can include any suitable number of filters coupled to a common node. For example, a multiplexer can be a duplexer, a triplexer that includes three filters, a quadplexer with four filters, a pentaplexer with five filters, a hexaplexer with six filters, an octoplexer with eight filters, etc. In some instances, a multiplexer can include 2 to 16 acoustic wave filters connected at a common node. The acoustic wave filters of a multiplexer can include any suitable combination of receive filters and/or transmit filters. One or more filters of a multiplexer can include acoustic wave resonators of two types in according with any suitable principles and advantages discussed herein.

Although embodiments discussed herein may relate to transmit filters that include two types of acoustic wave resonators, any suitable principles and advantages discussed herein can be applied to receive filters as suitable. For example, receive filters may include two or more types of acoustic wave resonators. Moreover, although embodiments discussed herein may relate to filters that include two types of acoustic wave resonators, three or more types of acoustic wave resonators may be included in a filter in accordance with the principles and advantages disclosed herein.

The duplexers and other multiplexers discussed herein can be implemented in a variety of radio frequency systems. Radio frequency systems can process signals having frequencies in a range from about 30 kHz to 300 GHz, such as in a range from about 450 MHz to 6 GHz. Filters disclosed herein can be implemented in such radio frequency systems as band pass filters with a passband that is within the range from about 450 MHz to 6 GHz. The passband of a band pass filter with two types of acoustic wave resonators can correspond to a frequency band of any suitable communication standard, such as Long Term Evolution (LTE) and/or 5G New Radio (NR). In some instances, the principles and advantages disclosed herein can be applied to filters arranged to filter radio frequencies at up to and including millimeter wave frequencies.

Figure 7:
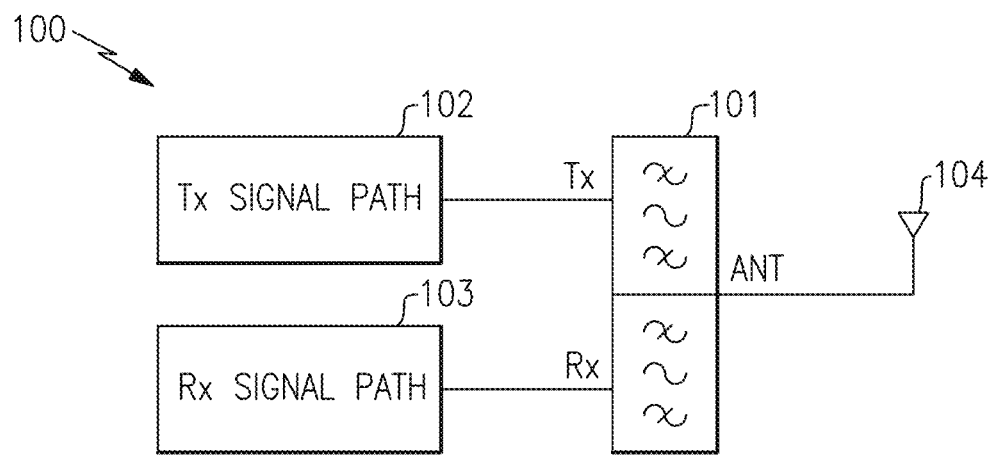
FIG. 7 is a schematic block diagram of an example radio frequency system that includes a duplexer according to an embodiment.

FIG. 7 is a schematic block diagram of an example radio frequency system 100 that includes a duplexer 101 according to an embodiment. The illustrated radio frequency system 100 includes a duplexer 101, a transmit signal path 102, a receive signal path 103, and an antenna 104. The duplexer 101 can implement any suitable combination of features of the duplexers discussed herein. The transmit signal path 102 can include a power amplifier and/or any suitable circuitry configured to provide a radio frequency signal to the duplexer 101. The illustrated duplexer 101 includes a transmit filter arranged to filter a radio frequency signal provided by the transmit signal path 102 and provide a filtered radio frequency transmit signal. The antenna 104 can transmit the filtered radio frequency transmit signal received from the duplexer 101. The illustrated duplexer 101 includes a receive filter arranged to filter a radio frequency signal received by the antenna 104 and provide a filtered radio frequency receive signal to the receive signal path 103. The receive signal path 103 can include a low noise amplifier and/or any suitable circuitry to process the filtered radio frequency receive signal.

Figure 8A:
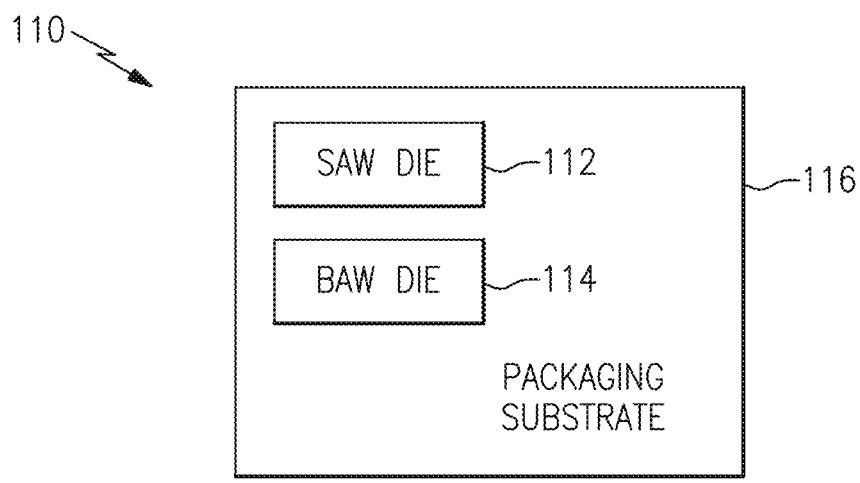
FIG. 8A is a block diagram of a filter assembly with die that include acoustic wave resonators of filters according to embodiments discussed herein.

FIG. 8A is a block diagram of a filter assembly 110 with different die that include acoustic wave resonators of one or more filters according to embodiments discussed herein. As illustrated, the filter assembly 110 includes a SAW die 112 and a BAW die 114 that are included on a common substrate 116. One or more acoustic wave filters can include resonators implemented on the SAW die 112 and the BAW die 114. The BAW die 114 can be a film bulk acoustic resonator (FBAR) die according to certain embodiments. The substrate 116 can be a laminate substrate or any other suitable packaging substrate. Resonators of one or more acoustic wave filters of a duplexer or other multiplexer can be implemented on the SAW die 112 and the BAW die 114. For instance, a transmit filter of a duplexer can include resonators of the SAW die 112 and the BAW die 114 in accordance with any suitable principles and advantages discussed herein. Resonators of a receive filter of the duplexer can include resonators of the SAW die 112. According to certain embodiments, a loop circuit includes SAW elements of the SAW die 112. Resonators of one or more duplexers or other multiplexers can be implemented on the SAW die 112 and the BAW die 114. For example, resonators for multiple duplexers can be implemented on the SAW die 112 and/or the BAW die 114.

In some embodiments, different SAW die and/or different BAW die can be implemented for different frequency ranges. Such die for different frequency ranges can include piezoelectric layers and/or metallization layers of different thicknesses.

Figure 8B:
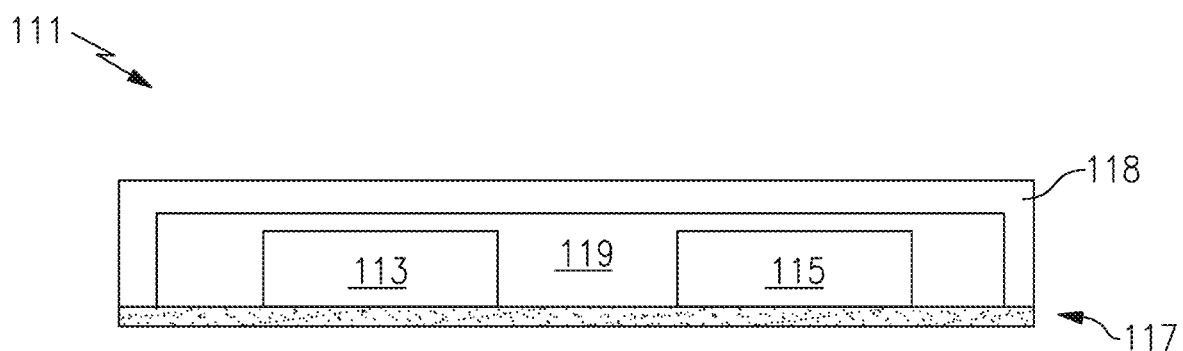
FIG. 8B is a block diagram of a filter assembly with a filter die that includes a first filter component and a second filter component according to embodiments discussed herein.

FIG. 8B is a schematic cross sectional side view of a filter assembly 111 with a filter die 117 that includes different filter components. As illustrated, the filter assembly 111 includes a first filter component 113 (e.g., SAW component) and a second filter component 115 (e.g., BAW component). One or more acoustic wave filters can include resonators implemented on the first filter component 113 and the second filter component 114. In addition, elements of a loop circuit can be implemented on the first filter component 113. The illustrated filter assembly 111 also includes a cap 118 and a cavity 119. The cap 118 can protect the first filter component 113 and/or the second filter component 115. The cap 118 can provide connections and/or shielding for the first filter component 113 and the second filter component 114. The cavity 119 can be an air cavity, for example.

Figure 9:
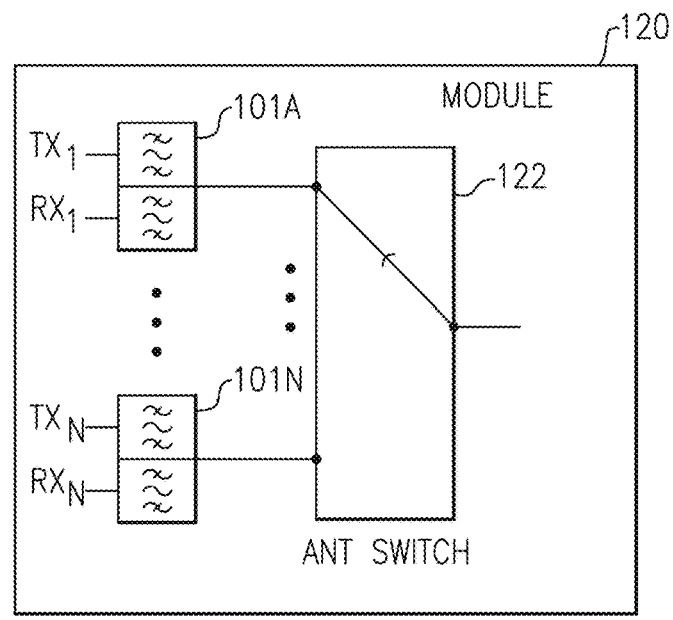
FIG. 9 is a schematic block diagram of a module that includes an antenna switch and duplexers in accordance with one or more embodiments.
Figure 10:
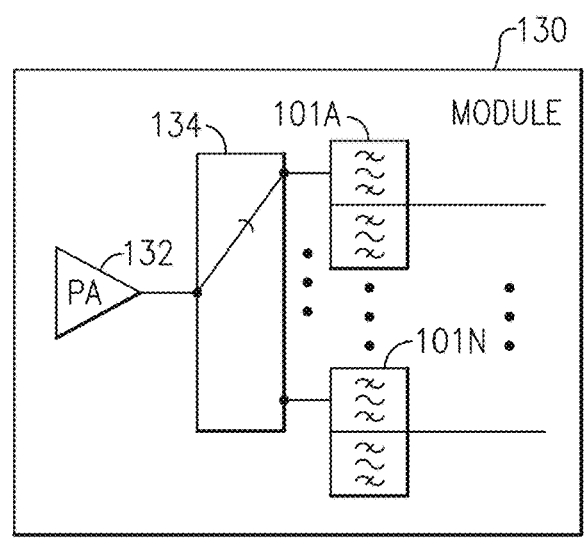
FIG. 10 is a schematic block diagram of a module that includes a power amplifier, a radio frequency switch, and duplexers in accordance with one or more embodiments.
Figure 11:
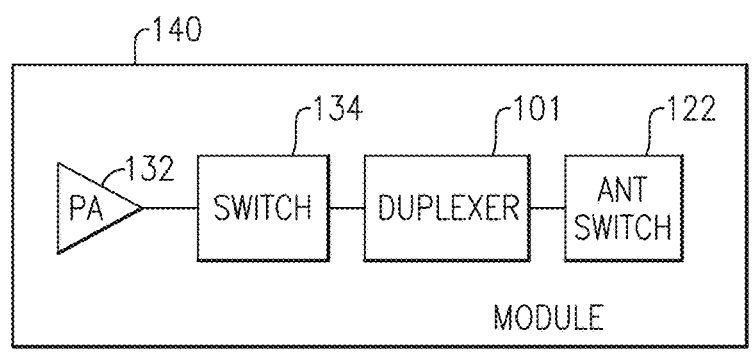
FIG. 11 is a schematic block diagram of a module that includes a power amplifier, a radio frequency switch, a duplexer in accordance with one or more embodiments, and an antenna switch.

The acoustic wave filters, duplexers, and other multiplexers discussed herein can be implemented in a variety of packaged modules. Some example packaged modules will now be discussed in which any suitable principles and advantages of the acoustic wave filters, duplexers and/or other multiplexers discussed herein can be implemented. The example packaged modules can include a package that encloses the illustrated circuit elements. The illustrated circuit elements can be disposed on a common packaging substrate. The packaging substrate can be a laminate substrate, for example. FIGS. 9, 10, and 11 are schematic block diagrams of illustrative packaged modules according to certain embodiments. Any suitable combination of features of these modules can be implemented with each other.

FIG. 9 is a schematic block diagram of a module 120 that includes duplexers 101A to 101N and an antenna switch 122. Any suitable number of duplexers 101A to 101N can be implemented. The antenna switch 122 can have a number of throws corresponding to the number of duplexers 101A to 101N. The antenna switch 112 can electrically couple a selected duplexer to an antenna port of the module 120. The one or more of the duplexers 101A to 101N can include an acoustic wave filter that includes two types of resonators in accordance with any suitable principles and advantages discussed herein. The duplexers 101A to 101N can include one or more SAW die and one or more BAW die. The duplexers 101A to 101N can include a filter die that includes one or more BAW resonators and one or more SAW resonators.

FIG. 10 is a schematic block diagram of a module 130 that includes a power amplifier 132, a radio frequency switch 134, and duplexers 101A to 101N in accordance with one or more embodiments. The power amplifier 132 can amplify a radio frequency signal. The radio frequency switch 134 can be a multi-throw radio frequency switch. The radio frequency switch 134 can electrically couple an output of the power amplifier 132 to a selected transmit filter of the duplexers 101A to 101N. Any suitable numbers of duplexers can be implemented. One or more of the duplexers 101A to 101N can be implemented in accordance with any suitable principles and advantages discussed herein. The duplexers 101A to 101N can include one or more SAW die and one or more BAW die. The duplexers 101A to 101N can include a filter die that includes one or more BAW resonators and one or more SAW resonators.

FIG. 11 is a schematic block diagram of a module 140 that includes a power amplifier 132, a radio frequency switch 134, and a duplexer 101 in accordance with one or more embodiments, and an antenna switch 122. The module 140 can include elements of the module 120 and elements of the module 130.

Figure 12:
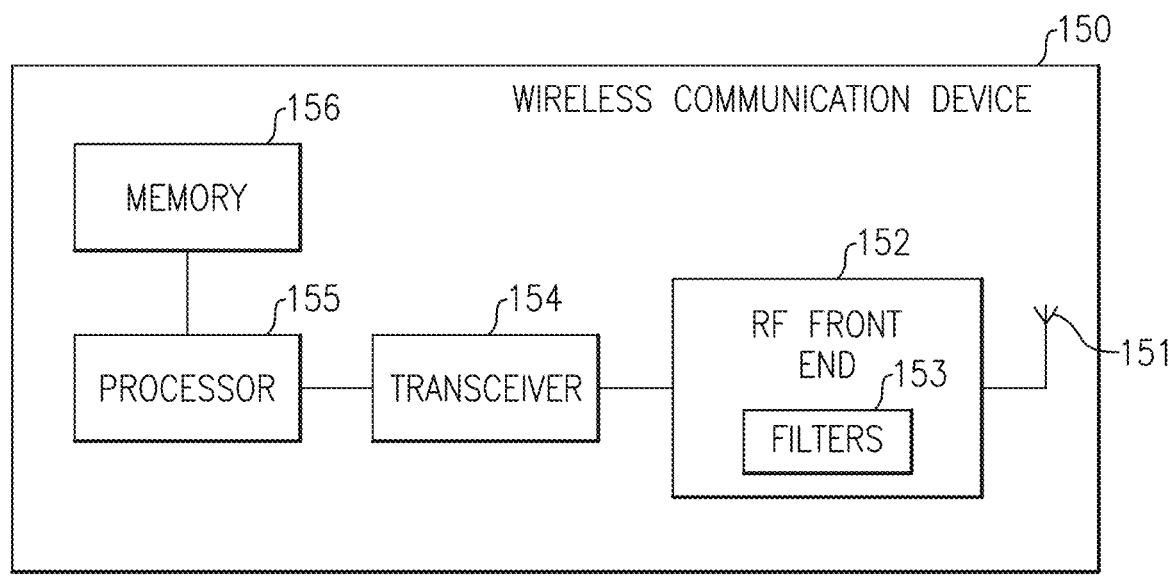
FIG. 12 is a schematic block diagram of a wireless communication device that includes filters in accordance with one or more embodiments.

FIG. 12 is a schematic block diagram of a wireless communication device 150 that includes filters 153 in accordance with one or more embodiments. The wireless communication device 150 can be any suitable wireless communication device. For instance, a wireless communication device 150 can be a mobile phone, such as a smart phone. As illustrated, the wireless communication device 150 includes an antenna 151, an RF front end 152, an RF transceiver 154, a processor 155, and a memory 156. The antenna 151 can transmit RF signals provided by the RF front end 152. The antenna 151 can provide received RF signals to the RF front end 152 for processing.

The RF front end 152 can include one or more power amplifiers, one or more low noise amplifiers, RF switches, receive filters, transmit filters, duplexer or other multiplexers, or any combination thereof. The RF front end 152 can transmit and receive RF signals associated with any suitable communication standards. Any of the acoustic wave filters, duplexers, and/or multiplexers discussed herein can be implemented by the filters 153 of the RF front end 152.

The RF transceiver 154 can provide RF signals to the RF front end 152 for amplification and/or other processing. The RF transceiver 154 can also process an RF signal provided by a low noise amplifier of the RF front end 152. The RF transceiver 154 is in communication with the processor 155. The processor 155 can be a baseband processor. The processor 155 can provide any suitable base band processing functions for the wireless communication device 150. The memory 156 can be accessed by the processor 155. The memory 156 can store any suitable data for the wireless communication device 150.

Some of the embodiments described above have provided examples in connection with mobile devices such as cellular handsets. However, the principles and advantages of the embodiments can be used for any other systems or apparatus, such as any uplink cellular device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as acoustic wave resonator die and/or filter assemblies and/or semiconductor die and/or packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context indicates otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments of the inventions have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A filter assembly comprising:
a transmit filter having an output coupled to a common node, the transmit filter including a first stage serially connected with at least a second stage, the first stage including a first plurality of acoustic wave resonators of a first type, the second stage including a second plurality of acoustic wave resonators of a second type but not the first type, the second plurality of acoustic wave resonators having a higher suppression of a second harmonic of a radio frequency signal than the first plurality of acoustic wave resonators; and
a receive filter having an input coupled to the common node, the receive filter configured to provide a single-ended radio frequency signal output.

2. The filter assembly of claim 1 wherein the first plurality of acoustic wave resonators of the first type are bulk acoustic wave resonators and the second plurality of acoustic wave resonators of the second type are surface acoustic wave resonators.

3. The filter assembly of claim 2 wherein the bulk acoustic wave resonators and the surface acoustic wave resonators are implemented on a common filter die.

4. The filter assembly of claim 1 wherein the filter assembly includes a first die that includes the first plurality of acoustic wave resonators of the first type and a second die that includes the second plurality of acoustic wave resonators of the second type.

5. The filter assembly of claim 1 further comprising a loop circuit coupled to the output of the receive filter and an input of the transmit filter, the loop circuit configured to generate an anti-phase signal to a target signal at a particular frequency.

6. The filter assembly of claim 5 wherein the loop circuit includes acoustic wave elements on a same die as the second plurality of acoustic wave resonators of the second type.

7. The filter assembly of claim 1 wherein the transmit filter and the receive filter are included in a duplexer.

8. The filter assembly of claim 1 further comprising a loop circuit coupled to the common node, the output of the receive filter and an input of the transmit filter, the loop circuit configured to generate an anti-phase signal to a target signal at a particular frequency.

9. The filter assembly of claim 1 further comprising a loop circuit coupled to the common node and the output of the receive filter, the loop circuit configured to generate an anti-phase signal to a target signal at a particular frequency.

10. The filter assembly of claim 1 wherein a combination of the first plurality of acoustic wave resonators of the first type and the second plurality of acoustic wave resonators of the second type improve antenna matching.

11. A method of processing a radio frequency signal, the method comprising:
    generating a filtered transmit radio frequency signal with transmit filter having a first stage serially connected with at least a second stage, the first stage including a first plurality of acoustic wave resonators of a first type, the second stage including a second plurality of acoustic wave resonators of a second type that is different than the first type, the second plurality of acoustic wave resonators having a higher suppression of a second harmonic of a radio frequency signal than the first plurality of acoustic wave resonators;
    outputting the filtered transmit radio signal to a common node; and
    filtering a receive radio frequency signal with a receive filter coupled to the common node to output a single-ended radio frequency signal.

12. The method of claim 11 wherein the first plurality of acoustic wave resonators of the first type are bulk acoustic wave resonators and the second plurality of acoustic wave resonators of the second type are surface acoustic wave resonators.

13. The method of claim 12 further comprising implementing the bulk acoustic wave resonators and the surface acoustic wave resonators on a common filter die.

14. The method of claim 11 further comprising including the first plurality of acoustic wave resonators of the first type on a first die and including the second plurality of acoustic wave resonators of the second type on a second die.

15. The method of claim 11 further comprising coupling a loop circuit to an output of the receive filter and an input of the transmit filter and generating with the loop circuit an anti-phase signal to a target signal at a particular frequency.

16. The method of claim 15 further including in the loop circuit, acoustic wave elements on a same die as the second plurality of acoustic wave resonators of the second type.

17. The method of claim 11 further comprising including the transmit filter and the receive filter in a duplexer.

18. The method of claim 11 further comprising coupling a loop circuit to the common node, the output of the receive filter and an input of the transmit filter and generating with the loop circuit an anti-phase signal to a target signal at a particular frequency.

19. The method of claim 11 further comprising coupling a loop circuit to the common node and the output of the receive filter and generating with the loop circuit an anti-phase signal to a target signal at a particular frequency.

20. The method of claim 11 further comprising improving antenna matching with a combination of the first plurality of acoustic wave resonators of the first type and the second plurality of acoustic wave resonators of the second type.

\* \* \* \* \*